(12) United States Patent
Tu et al.

(10) Patent No.: US 9,263,635 B2
(45) Date of Patent: Feb. 16, 2016

(54) SEMICONDUCTOR STRUCTURE

(71) Applicant: Genesis Photonics Inc., Tainan (TW)

(72) Inventors: Sheng-Han Tu, Tainan (TW); Chi-Feng Huang, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 14/707,009

(22) Filed: May 8, 2015

(65) Prior Publication Data

US 2015/0333220 A1 Nov. 19, 2015

(30) Foreign Application Priority Data

May 19, 2014 (TW) .............................. 103117502 A

(51) Int. Cl.
*H01L 21/00* (2006.01)
*H01L 33/12* (2010.01)
*H01L 29/20* (2006.01)
*H01L 29/205* (2006.01)
*H01L 23/00* (2006.01)
*H01L 33/32* (2010.01)

(52) U.S. Cl.
CPC .............. *H01L 33/12* (2013.01); *H01L 23/562* (2013.01); *H01L 29/2003* (2013.01); *H01L 29/205* (2013.01); *H01L 33/32* (2013.01)

(58) Field of Classification Search
CPC ....... H01L 33/12; H01L 23/562; H01L 33/32; H01L 29/2003
See application file for complete search history.

(56) References Cited

U.S. PATENT DOCUMENTS

| | | | | |
|---|---|---|---|---|
| 7,012,016 B2 * | 3/2006 | Gwo | ................. | H01L 21/02381 438/602 |
| 7,655,090 B2 * | 2/2010 | Marchand | ................ | C30B 25/02 117/102 |
| 7,687,888 B2 * | 3/2010 | Marchand | ................ | C30B 25/02 117/107 |
| 7,816,764 B2 * | 10/2010 | Marchand | ................ | C30B 25/02 117/107 |
| 8,525,230 B2 * | 9/2013 | Marchand | ................ | C30B 25/02 257/194 |
| 8,772,131 B2 * | 7/2014 | Pham | ..................... | H01L 33/32 257/E21.211 |
| 9,105,827 B2 * | 8/2015 | Pham | ..................... | H01L 33/32 |
| 9,129,977 B2 * | 9/2015 | Marchand | ................ | C30B 25/02 |
| 2004/0178406 A1 * | 9/2004 | Chu | ................... | H01L 21/02381 257/19 |
| 2005/0106849 A1 * | 5/2005 | Gwo | ................. | H01L 21/02381 438/602 |
| 2008/0102610 A1 * | 5/2008 | Marchand | ................ | C30B 25/02 438/483 |
| 2009/0042344 A1 * | 2/2009 | Ye | ..................... | H01L 29/66462 438/172 |
| 2009/0242898 A1 * | 10/2009 | Marchand | ................ | C30B 25/02 257/76 |
| 2011/0108886 A1 * | 5/2011 | Marchand | ................ | C30B 25/02 257/194 |
| 2012/0068191 A1 * | 3/2012 | Marchand | ................ | C30B 25/02 257/76 |
| 2013/0134436 A1 * | 5/2013 | Pham | ..................... | H01L 33/32 257/76 |
| 2014/0327010 A1 * | 11/2014 | Pendharkar | ......... | H01L 27/0255 257/76 |
| 2014/0367698 A1 * | 12/2014 | Marchand | ................ | C30B 25/02 257/76 |
| 2015/0115277 A1 * | 4/2015 | Motsnyi | ............ | H01L 21/02458 257/76 |

FOREIGN PATENT DOCUMENTS

BE   EP 2869331 A1 *  5/2015  ........ H01L 21/02458
JP   2012218952 A  * 11/2012

* cited by examiner

*Primary Examiner* — Laura Menz

(74) *Attorney, Agent, or Firm* — Jianq Chyun IP Office

(57) ABSTRACT

A semiconductor structure includes a silicon substrate, a buffer layer, a nitride-based epitaxial structure layer and multiple discontinuous strain-releasing layers. The buffer layer is disposed on the silicon substrate. The nitride-based epitaxial structure layer is disposed on the buffer layer. The discontinuous strain-releasing layers are disposed between the silicon substrate and the nitride-based epitaxial structure layer, wherein a material of the discontinuous strain-releasing layers is silicon nitride.

11 Claims, 3 Drawing Sheets

SEMICONDUCTOR STRUCTURE

CROSS-REFERENCE TO RELATED APPLICATION

This application claims the priority benefit of Taiwan application serial no. 103117502, filed on May 19, 2014. The entirety of the above-mentioned patent application is hereby incorporated by reference herein and made a part of this specification.

BACKGROUND OF THE INVENTION

1. Field of the Invention

The invention relates to a semiconductor structure, and relates particularly to a semiconductor structure having discontinuous strain-releasing layers.

2. Description of Related Art

With the progress of semiconductor technologies, a light emitting diode (LED) now has advantages of high luminance, low power consumption, compactness, low driving voltage, being mercury free, and so forth. Therefore, the LED has been extensively applied in the field of displays and illumination. In general, an LED chip is fabricated by using a broad band-gap semiconductor material, such as gallium nitride (GaN). However, in addition to the difference in thermal expansion coefficient and chemical properties, the difference between the lattice constant of GaN and that of a hetero-substrate cannot be ignored. Hence, due to lattice mismatch, GaN grown on the hetero-substrate undergoes lattice dislocation, and the lattice dislocation extends toward a thickness direction of the GaN layer. Further, because of lattice mismatch between GaN and the hetero-substrate, the material of GaN relative to the hetero-substrate will create great structural stress. As the growth thickness becomes thicker, the stress accumulated becomes greater. When exceeding a threshold value, the material layer will be unable to support the stress, and must deform to release the stress. As such, the lattice dislocation not only causes crystal growth defects which reduce the light emitting efficiency of the LED and shortens lifetime, it also can not grow very thick GaN.

SUMMARY OF THE INVENTION

The invention provides a semiconductor structure, having discontinuous strain-releasing layers, able to release the stress problem caused by a conventional lattice mismatch and is able to reduce lattice dislocation from extending in a thickness direction.

A semiconductor structure of the invention includes a silicon substrate, a buffer layer, a nitride-based epitaxial structure layer and a plurality of discontinuous strain-releasing layers. The buffer layer is disposed on the silicon substrate. The nitride-based epitaxial structure layer is disposed on the buffer layer. The discontinuous strain-releasing layers are disposed between the silicon substrate and the nitride-based epitaxial structure layer, wherein a material of the discontinuous strain-releasing layers is silicon nitride.

In an embodiment of the invention, a thickness of each of the discontinuous strain-releasing layers is lesser than 1 micrometer.

In an embodiment of the invention, the discontinuous strain-releasing layers are located in the buffer layer.

In an embodiment of the invention, the discontinuous strain-releasing layers are located in the nitride-based epitaxial structure layer.

In an embodiment of the invention, the nitride-based epitaxial structure layer includes a first nitride-based epitaxial structure layer and a second nitride-based epitaxial structure layer, and the first nitride-based epitaxial structure layer is disposed between the second nitride-based epitaxial structure layer and the buffer layer.

In an embodiment of the invention, the first nitride-based epitaxial structure layer is an aluminum gallium nitride (AlGaN) layer, an aluminum nitride (AlN)/gallium nitride (GaN) super lattice structure (SLs) layer or an aluminum indium gallium nitride (AlInGaN) layer, and the second nitride-based epitaxial structure layer is a gallium nitride (GaN) layer.

In an embodiment of the invention, the discontinuous strain-releasing layers are disposed in the first nitride-based epitaxial structure layer, and two adjacent discontinuous strain-releasing layers are spaced apart by a distance.

In an embodiment of the invention, the discontinuous strain-releasing layers are disposed in the second nitride-based epitaxial structure layer, and two adjacent discontinuous strain-releasing layers are spaced apart by a distance.

In an embodiment of the invention, one of the discontinuous strain-releasing layers is disposed in the first nitride-based epitaxial structure layer, and another one of the discontinuous strain-releasing layers is disposed in the second nitride-based epitaxial structure layer, and the discontinuous strain-releasing layer located in the first nitride-based epitaxial structure layer and the discontinuous strain-releasing layer located in the second nitride-based epitaxial structure layer are spaced apart by a distance.

In an embodiment of the invention, the discontinuous strain-releasing layers are simultaneously disposed in the buffer layer, the first nitride-based epitaxial structure layer and the second nitride-based epitaxial structure layer, and two adjacent discontinuous strain-releasing layers are spaced apart by a distance.

In an embodiment of the invention, one of the discontinuous strain-releasing layers is located in the nitride-based epitaxial structure layer, and another one of the discontinuous strain-releasing layers is located in the buffer layer, and the discontinuous strain-releasing layer located in the nitride-based epitaxial structure layer and the discontinuous strain-releasing layer located in the buffer layer are spaced apart by a distance.

Based on the above, because the semiconductor structure of the present embodiment has the discontinuous strain-releasing layers made of the silicon nitride material disposed between the silicon substrate and the nitride-based epitaxial structure layer, therefore the stress caused from the lattice difference between the nitride-based epitaxial structure layer and the silicon substrate can be effectively reduced. In addition, lattice dislocation extending in a thickness direction and the defect density can also be effectively reduced, improving the overall quality of the semiconductor structure.

Several exemplary embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
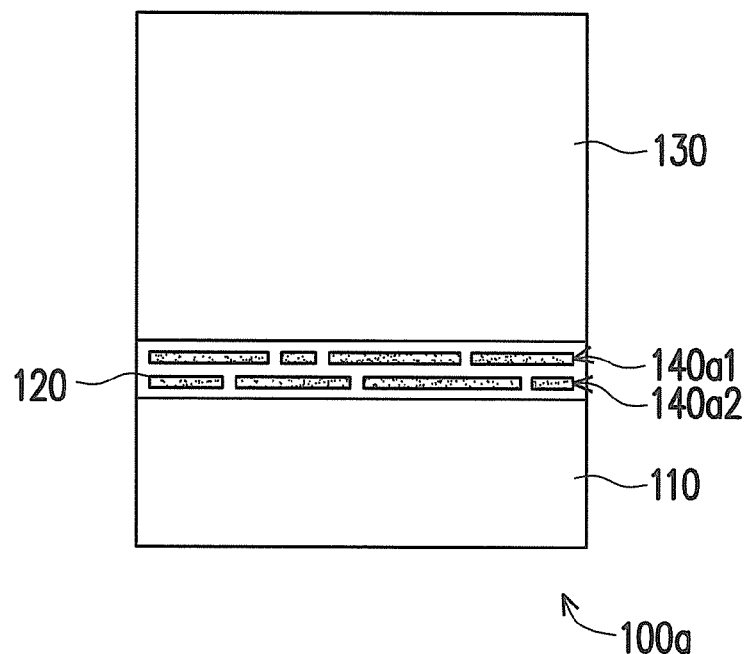
FIG. 1 illustrates a cross-sectional schematic diagram of a semiconductor structure according to an embodiment of the invention.

FIG. 1 illustrates a cross-sectional schematic diagram of a semiconductor structure according to an embodiment of the invention. Referring to FIG. 1, in the present embodiment, a semiconductor structure 100a includes a silicon substrate 110, a buffer layer 120, a nitride-based epitaxial structure layer 130 and a plurality of discontinuous strain-releasing layers 140a1, 140a2 (here, only two are schematically shown, however is not limited thereto). The buffer layer 120 is disposed on the silicon substrate 110. The nitride-based epitaxial structure layer 130 is disposed on the buffer layer 120. The discontinuous strain-releasing layers 140a1, 140a2 are disposed between the silicon substrate 110 and the nitride-based epitaxial structure layer 130, wherein a material of the discontinuous strain-releasing layers 140a1, 140a2 is silicon nitride.

More specifically, as shown in FIG. 1, the discontinuous strain-releasing layers 140a1, 140a2 of the present embodiment are located in the buffer layer 120. Preferably, a thickness of each of the discontinuous strain-releasing layers 140a1, 140a2 are lesser than 1 micrometer, which may release stress of the nitride-based epitaxial structure layer 130 without affecting the overall growth of the nitride-based epitaxial structure layer 130. In addition, the buffer layer 120 of the present embodiment specifically is an aluminum nitride layer, and the nitride-based epitaxial structure layer 130 is specifically an aluminum gallium nitride layer, an aluminum nitride/gallium nitride super lattice structure layer, an aluminum indium gallium nitride layer, a gallium nitride layer or an epitaxial structure layer including at least two types stacked together chosen from the above mentioned four types of material layers and it should not be construed as a limitation to the invention.

Because the semiconductor structure 100a of the present embodiment has the discontinuous strain-releasing layers 140a1, 140a2 made of silicon nitride material disposed between the silicon substrate 110 and the nitride-based epitaxial structure layer 130, specifically the discontinuous strain-releasing layers 140a1, 140a2 of the present embodiment is located in the buffer layer 120, therefore may aid in mitigating the stress caused by differences in the coefficient of thermal expansion and lattice between the nitride-based epitaxial structure layer 130 and the silicon substrate 110. Also, formation of dislocations prior to the growth of the discontinuous strain-releasing layers 140a1, 140a2 may be prevented such that the dislocations can not continue to grow upwards and may lower defect density and further enhancing quality of the overall semiconductor structure 100a.

It should be noted here, the below embodiments utilize the same label and partial contents of the above embodiment, wherein the same labels are adopted to represent same or similar elements and the description of similar technical content is omitted. Reference may be made to the above embodiment for the description of omitted parts and will not be repeated in the below embodiments.

Figure 2:
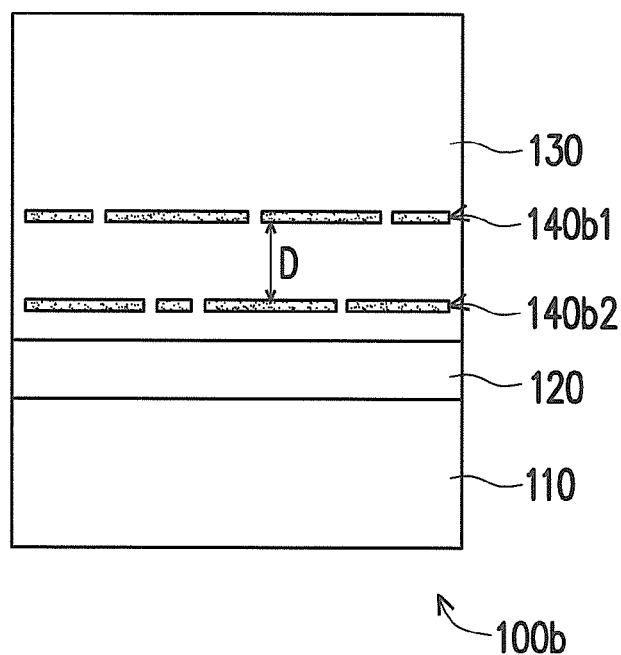
FIG. 2 illustrates a cross-sectional schematic diagram of a semiconductor structure according to another embodiment of the invention.

FIG. 2 illustrates a cross-sectional schematic diagram of a semiconductor structure according to another embodiment of the invention. Referring to FIG. 1 and FIG. 2, a semiconductor structure 100b of the present embodiment and the semiconductor structure 100a of FIG. 1 are similar. The main difference between the two lies in: a plurality of discontinuous strain-releasing layers 140b1, 140b2 of the semiconductor structure 100b of the present embodiment are disposed in the nitride-based epitaxial structure layer 130, and the discontinuous strain-releasing layers 140b1, 140b2 are spaced apart by a distance D. The stress release ability is made more apparent by a dispersed arrangement of the discontinuous strain-releasing layers 140b1, 140b2. Preferably, a material of the discontinuous strain-releasing layers 140b1, 140b2 is silicon nitride, and a thickness of the discontinuous strain-releasing layers 140b1, 140b2 are lesser than 1 micrometer.

Figure 3:
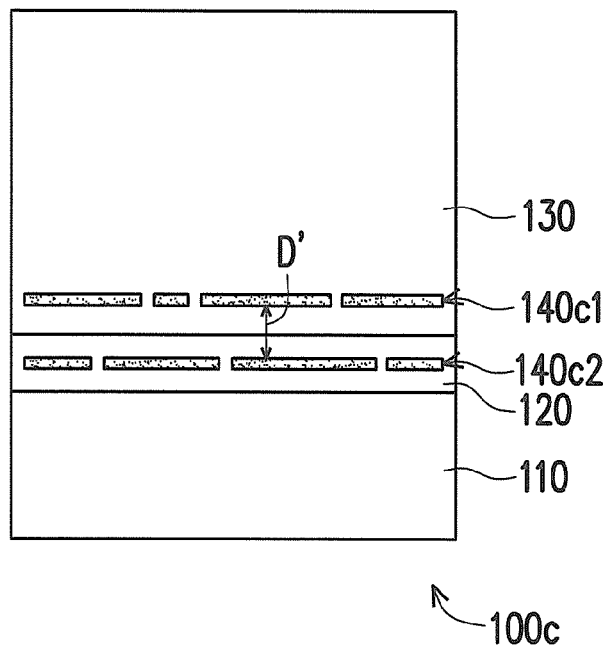
FIG. 3 illustrates a cross-sectional schematic diagram of a semiconductor structure according to another embodiment of the invention.

FIG. 3 illustrates a cross-sectional schematic diagram of a semiconductor structure according to another embodiment of the invention. Referring to FIG. 1 and FIG. 3, a semiconductor structure 100c of the present embodiment and the semiconductor structure 100a of FIG. 1 are similar. The main difference between the two lies in: a discontinuous strain-releasing layer 140c1 of the present embodiment is located in the nitride-based epitaxial structure layer 130, and the discontinuous strain-releasing layer 140c2 is located in the buffer layer 120, and the discontinuous strain-releasing layer 140c1 located in the nitride-based epitaxial structure layer 130 and the discontinuous strain-releasing layer 140c2 located in the buffer layer 120 are spaced apart by a distance D'.

Figure 4:
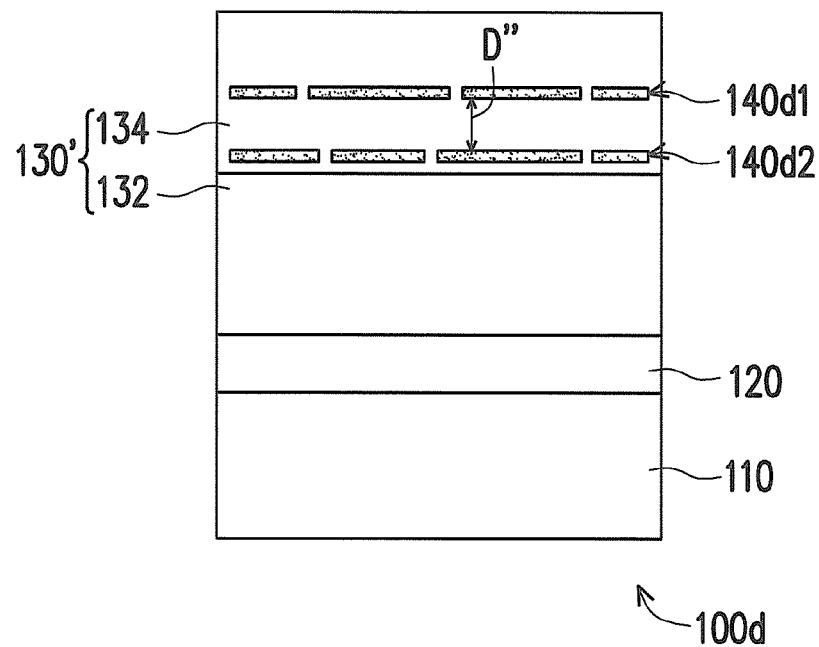
FIG. 4 illustrates a cross-sectional schematic diagram of a semiconductor structure according to another embodiment of the invention.

FIG. 4 illustrates a cross-sectional schematic diagram of a semiconductor structure according to another embodiment of the invention. Referring to FIG. 2 and FIG. 4, a semiconductor structure 100d of the present embodiment and the semiconductor structure 100b of FIG. 2 are similar. The main difference between the two lies in: a nitride-based epitaxial structure layer 130' of the present embodiment, specifically includes a first nitride-based epitaxial structure layer 132 and a second nitride-based epitaxial structure layer 134, wherein the first nitride-based epitaxial structure layer 132 is disposed between the second nitride-based epitaxial structure layer 134 and the buffer layer 120. Here, the first nitride-based epitaxial structure layer 132, for example, is an aluminum gallium nitride layer, an aluminum nitride/gallium nitride super lattice structure layer or an aluminum indium gallium nitride layer, and the second nitride-based epitaxial structure layer 134, for example, is a gallium nitride layer, however is not limited thereto. In addition, discontinuous strain-releasing layers 140d1, 140d2 of the semiconductor structure 100d of the present embodiment are specifically disposed in the second nitride-based epitaxial structure layer 134 and spaced apart by a distance D". Of course, in other embodiments not shown, the discontinuous strain-releasing layers 140d1, 140d2 may also be disposed in the first nitride-based epitaxial structure layer 132 and spaced apart by a distance D", and is still in the scope desired to be protected by the invention. Preferably, a material of the discontinuous strain-releasing layers 140d1, 140d2 is silicon nitride, and a thickness of the discontinuous strain-releasing layers 140d1, 140d2 are lesser than 1 micrometer.

Figure 5:
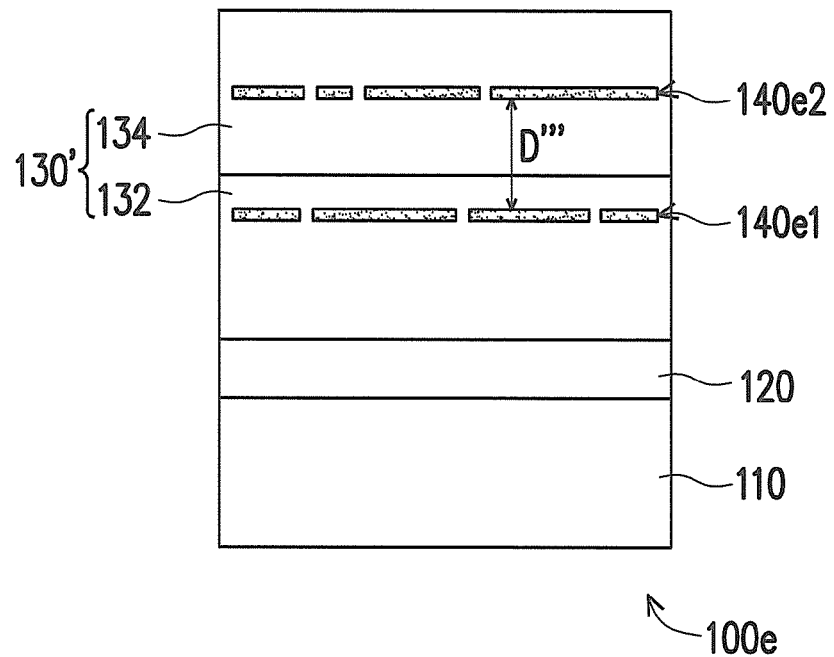
FIG. 5 illustrates a cross-sectional schematic diagram of a semiconductor structure according to another embodiment of the invention.

FIG. 5 illustrates a cross-sectional schematic diagram of a semiconductor structure according to another embodiment of the invention. Referring to FIG. 4 and FIG. 5, a semiconductor structure 100e of the present embodiment and the semiconductor structure 100d of FIG. 4 are similar. The main difference between the two lies in: a discontinuous strain-releasing layer 140e1 of the semiconductor structure 100e of the present embodiment is disposed in the first nitride-based epitaxial structure layer 132, and a discontinuous strain-releasing layer 140e2 is disposed in the second nitride-based epitaxial structure layer 134, and the discontinuous strain-releasing layer 140e1 located in the first nitride-based epitaxial structure layer 132 and the discontinuous strain-releasing layer 140e2 located in the second nitride-based epitaxial structure layer 134 are spaced apart by a distance D'''. Preferably, a material of the discontinuous strain-releasing layers 140e1, 140e2 is silicon nitride, and a thickness of the discontinuous strain-releasing layers 140e1, 140e2 are lesser than 1 micrometer.

Figure 6:
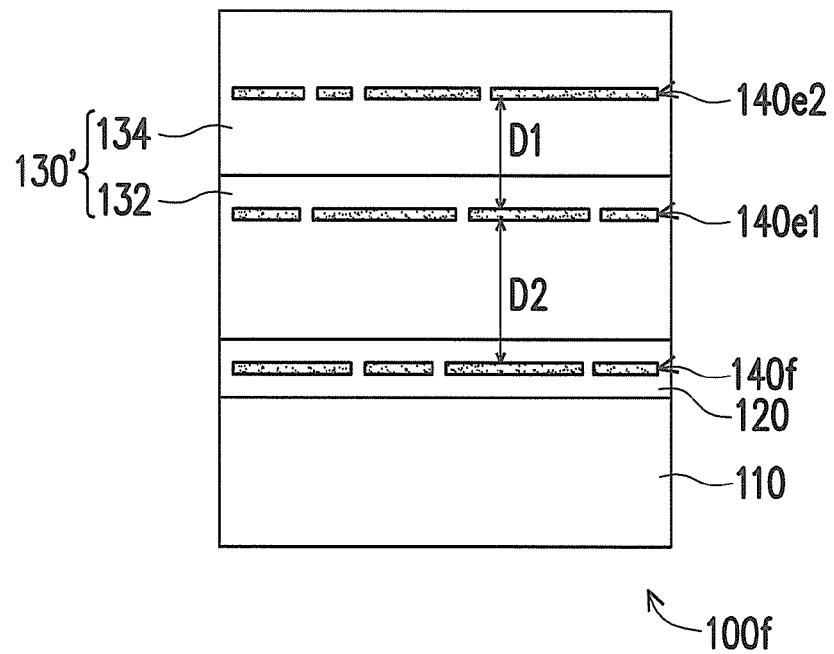
FIG. 6 illustrates a cross-sectional schematic diagram of a semiconductor structure according to another embodiment of the invention.

FIG. 6 illustrates a cross-sectional schematic diagram of a semiconductor structure according to another embodiment of the invention. Referring to FIG. 5 and FIG. 6, a semiconductor structure 100f of the present embodiment and the semiconductor structure 100e of FIG. 5 are similar. The main difference between the two lies in: a semiconductor structure 100f of the present embodiment further includes a discontinuous strain-releasing layer 140f, wherein the discontinuous strain-releasing layer 140f is disposed in the buffer layer 120. That is to say, the discontinuous strain-releasing layers 140e1, 140e2, 140f are disposed in the first nitride-based epitaxial structure layer 132, the second nitride-based epitaxial structure layer 134 and the buffer layer 120 at the same time respectively, and the discontinuous strain-releasing layer 140e1 and the discontinuous strain-releasing layer 140e2 are spaced apart by a distance D1, and the discontinuous strain-releasing layer 140e1 and the discontinuous strain-releasing layer 140f are spaced apart by a distance D2. Preferably, a material of the discontinuous strain-releasing layers 140f is silicon nitride, and a thickness of the discontinuous strain-releasing layers 140f is lesser than 1 micrometer.

In summary, because the semiconductor structure of the present embodiment has the discontinuous strain-releasing layers made of the silicon nitride material disposed between the silicon substrate and the nitride-based epitaxial structure layer, wherein the discontinuous strain-releasing layers may be located at the buffer layer, the nitride-based epitaxial structure layer or in the buffer layer and the nitride-based epitaxial structure layer, therefore the invention may lessen the stress caused by differences in lattice of the nitride-based epitaxial structure layer and the silicon substrate by the discontinuous strain-releasing layers. Also, formation of dislocations prior to the growth of the discontinuous strain-releasing layers may be prevented and lowers the phenomenon of the lattice dislocations extending in the thickness direction and lower defect density and further enhancing quality of the overall semiconductor structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor structure, comprising:
   a silicon substrate;
   a buffer layer, disposed on the silicon substrate;
   a nitride-based epitaxial structure layer, disposed on the buffer layer; and
   a plurality of discontinuous strain-releasing layers, disposed between the silicon substrate and the nitride-based epitaxial structure layer, wherein a material of the discontinuous strain-releasing layers is silicon nitride.

2. The semiconductor structure as claimed in claim 1, wherein a thickness of each of the discontinuous strain-releasing layers is lesser than 1 micrometer.

3. The semiconductor structure as claimed in claim 1, wherein the discontinuous strain-releasing layers are located in the buffer layer.

4. The semiconductor structure as claimed in claim 1, wherein the discontinuous strain-releasing layers are located in the nitride-based epitaxial structure layer.

5. The semiconductor structure as claimed in claim 4, wherein the nitride-based epitaxial structure layer comprises a first nitride-based epitaxial structure layer and a second nitride-based epitaxial structure layer, and the first nitride-based epitaxial structure layer is disposed between the second nitride-based epitaxial structure layer and the buffer layer.

6. The semiconductor structure as claimed in claim 5, wherein the first nitride-based epitaxial structure layer is an aluminum gallium nitride layer, an aluminum nitride/gallium nitride super lattice structure layer or an aluminum indium gallium nitride layer, and the second nitride-based epitaxial structure layer is a gallium nitride layer.

7. The semiconductor structure as claimed in claim 5, wherein the discontinuous strain-releasing layers are disposed in the first nitride-based epitaxial structure layer, and two adjacent discontinuous strain-releasing layers are spaced apart by a distance.

8. The semiconductor structure as claimed in claim 5, wherein the discontinuous strain-releasing layers are disposed in the second nitride-based epitaxial structure layer, and two adjacent discontinuous strain-releasing layers are spaced apart by a distance.

9. The semiconductor structure as claimed in claim 5, wherein one of the discontinuous strain-releasing layers is disposed in the first nitride-based epitaxial structure layer, and another one of the discontinuous strain-releasing layers is disposed in the second nitride-based epitaxial structure layer, and the discontinuous strain-releasing layer located in the first nitride-based epitaxial structure layer and the discontinuous strain-releasing layer located in the second nitride-based epitaxial structure layer are spaced apart by a distance.

10. The semiconductor structure as claimed in claim 5, wherein the discontinuous strain-releasing layers are simultaneously disposed in the buffer layer, the first nitride-based epitaxial structure layer and the second nitride-based epitaxial structure layer, and two adjacent discontinuous strain-releasing layers are spaced apart by a distance.

11. The semiconductor structure as claimed in claim 1, wherein one of the discontinuous strain-releasing layers is located in the nitride-based epitaxial structure layer, and another one of the discontinuous strain-releasing layers is located in the buffer layer, and the discontinuous strain-releasing layer located in the nitride-based epitaxial structure layer and the discontinuous strain-releasing layer located in the buffer layer are spaced apart by a distance.

* * * * *